(12) United States Patent
Oliver et al.

(10) Patent No.: US 6,740,902 B2
(45) Date of Patent: May 25, 2004

(54) SEMICONDUCTOR PACKAGE FOR SERIES-CONNECTED DIODES

(75) Inventors: Stephen Oliver, Redondo Beach, CA (US); Hugh D. Richard, Meopham (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/377,683

(22) Filed: Feb. 28, 2003

(65) Prior Publication Data

US 2004/0041230 A1 Mar. 4, 2004

Related U.S. Application Data

(60) Provisional application No. 60/408,519, filed on Sep. 4, 2002.

(51) Int. Cl.$^7$ .......................... H01L 27/15; H01L 31/12; H01L 33/00
(52) U.S. Cl. .............................. 257/81; 257/88; 257/99
(58) Field of Search .............................. 257/81, 88, 99

(56) References Cited

U.S. PATENT DOCUMENTS 6,335,548 B1 * 1/2002 Roberts et al. ............... 257/98

\* cited by examiner

*Primary Examiner*—David A. Zarneke
(74) *Attorney, Agent, or Firm*—Ostrolenk, Faber, Gerb & Soffen, LLP

(57) ABSTRACT

Two series-connected diodes which are housed in a power package (such as but not limited to TO220, TO220FP, D2pak, TO247, etc.).

8 Claims, 1 Drawing Sheet

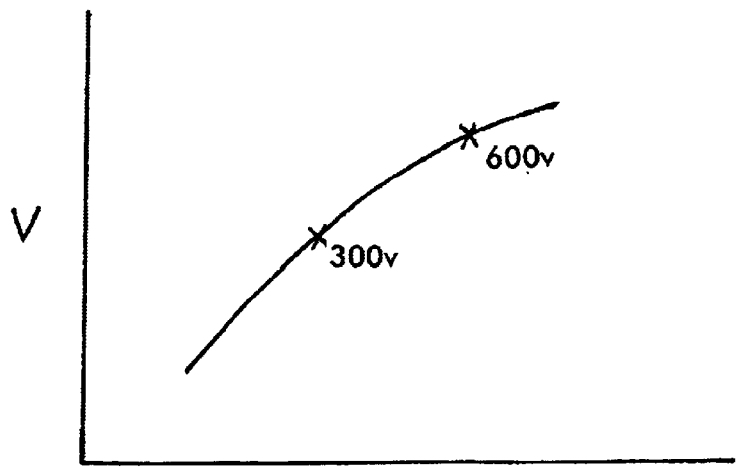
FIG. 1
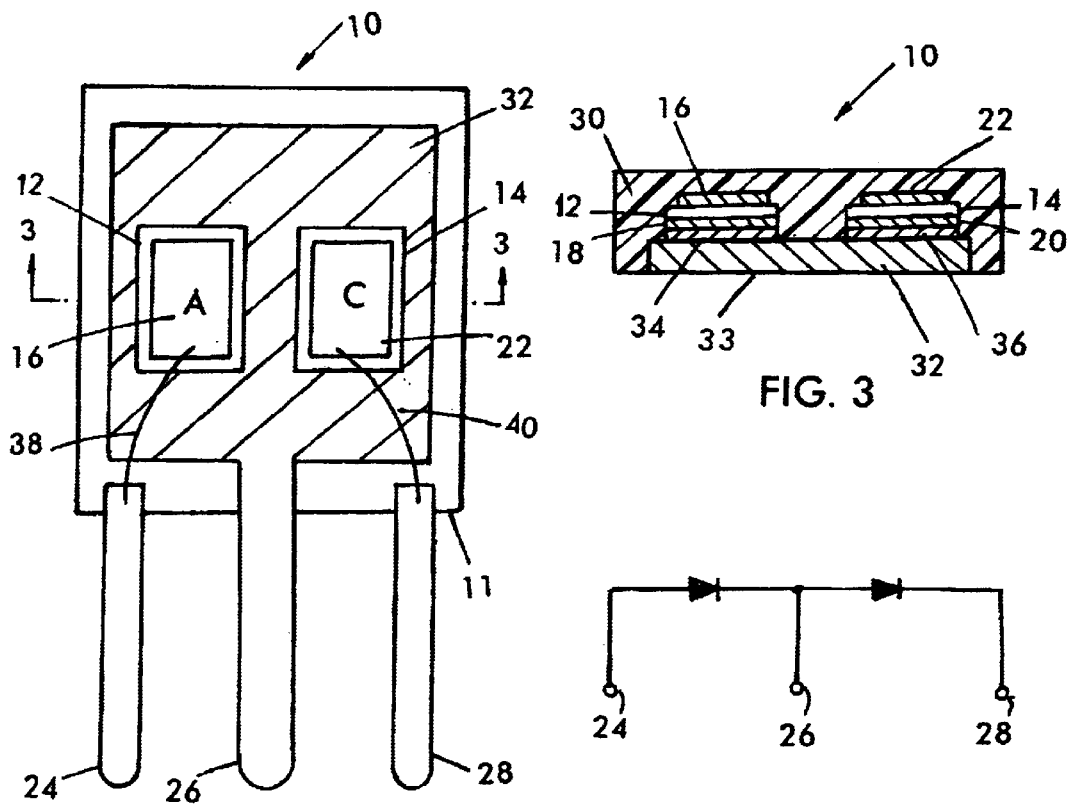
FIG. 2
FIG. 3
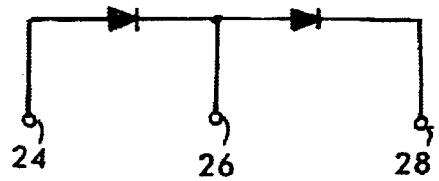
FIG. 4

SEMICONDUCTOR PACKAGE FOR SERIES-CONNECTED DIODES

RELATED APPLICATION

This application is based on and claims priority to U.S. Provisional Application No. 60/408,519, filed on Sep. 4, 2002, by Steven Oliver and Hugh D. Richard, entitled "Semiconductor Package For Series-Connected Diodes," the subject matter and disclosure of which is incorporated by reference herein.

FIELD OF THE INVENTION

The present invention relates to semiconductor device packages and more particularly to packages that include at least two series-connected diodes.

BACKGROUND AND SUMMARY OF THE INVENTION

Very fast diodes are needed for continuous mode power factor correction (PFC). Also, in continuous mode PFC high voltage diodes, e.g., 600V or more, are desirable. However, as illustrated by FIG. 1, due to relatively slower reverse recovery time at higher voltage ratings, a diode having a high voltage rating suffers from relatively slower recovery time.

To overcome the above-noted disadvantages, a semiconductor device package according to the present invention includes at least two series-connected diodes of matched or similar voltage rating. Each individual diode is preferably rated for a relatively lower voltage application than would be necessary for a diode in a given continuous mode PFC application. However, the combination of the two series-connected diodes provides the desired voltage rating. Advantageously, the series-connected diodes exhibit better speed than a single diode of similar or identical voltage rating.

One aspect of the present invention the series-connected diodes are housed in a standard power package such as but not limited to a TO-220, D2 pak, TO220FP, TO297, etc. which does not include internal insulation. This type of package is often used to house a switching device such as a MOSFET or an IGBT. A conventional package includes three parallel leads, one of which (usually the center lead) may be integral with a conductive pad. In the present invention, the conductive pad of the package is used to connect an anode of one diode to the cathode of another diode in order to connect the two in series. The free electrode of each of the diodes is then connected by a wire bond to a respective free external lead of the package. Thus, according to the present invention, the lead that is integral with the conductive pad of the package (usually the center lead) may be used as a tap, while the other two leads can be used as respective connection terminals of the series-connected diodes.

Other features and advantages of the present invention will become apparent from the following description of the invention which refers to the accompanying drawings.

BRIEF DESCRIPTION OF THE FIGURES

FIG. 1 graphically shows the general relationship between the reverse recovery and voltage rating of diodes;

FIG. 2 shows the top view of a semiconductor package according to the present invention having a top portion of its housing removed from view for better illustration;

FIG. 3 shows a cross-sectional view of the semiconductor device shown in FIG. 2 along line 3—3 looking in the direction of the arrows; and FIG. 4 schematically shows the circuit arrangement of the diodes in a semiconductor device package according to the present invention. A reversed direction is also possible.

DETAILED DESCRIPTION OF THE FIGURES

Referring to FIG. 2, semiconductor device package 10 according to the first embodiment of the present invention includes first diode 12 and second diode 14. First diode 12 include anode electrode 16 on a major surface thereof and cathode electrode 18 (FIG. 3) on an opposing major surface thereof. Similarly, second diode 14 includes anode electrode 20 (FIG. 3) on a major surface thereof and cathode electrode 22 on an opposing major surface thereof.

First diode 12 and second diode 14 are preferably housed in a standard package. A typical package includes three parallel, spaced external leads 24, 26, 28. External leads 24, 26, 28 are disposed at a common side 11 of semiconductor device package 10 and extend from the interior of molded housing 30 (FIG. 3) to the exterior of the same.

In the preferred embodiment of the present invention, intermediate external lead 26 is integrally connected to conductive pad 32 such that it forms a unitary paddle-shaped body with the same. The bottom surface 33 of conductive pad 32 is exposed as shown in FIG. 3 in order to dissipate the heat that is generated by first diode 12 and second diode 14. To improve heat dissipation semiconductor device package 10 may be disposed on top of a heat sink (not shown) such that conductive pad 32 is placed in intimate thermal contact with the heat sink in order to extract heat from the same.

Referring to FIGS. 2 and 3 simultaneously, cathode electrode 18 of first diode 12 is electrically connected and physically mounted to conductive pad 32 by a layer 34 of solder, conductive epoxy or a similar conductive adhesive. Conversely, anode electrode 20 of second diode 14 is electrically connected and physically mounted to conductive pad 32 by a layer 36 of solder, conductive epoxy or a similar conductive adhesive. As a result, cathode electrode 18 of first diode 12 and anode electrode 20 of second diode 14 are electrically connected in series through conductive pad 32.

Referring to FIG. 2, anode electrode 16 of first diode 12 is connected to external lead 24 by at least wire bond 38; while cathode electrode 22 of second diode 14 is electrically connected to external lead 28 by at least wire bond 40. External lead 24 and external lead 28 serve as external terminals for the series-connected first diode 12 and second diode 14, while intermediate external lead 26 can serve as an optional tap between the series-connected diodes as schematically illustrated by FIG. 4.

In the first embodiment, first diode 12 and second diode 14 are rated at 300 V for a combined 600 V rating. In such a combination, the total speed of the series-connected diodes is that of the fastest diode. Thus, for example, if one diode recovers in 19 ms and the other in 23 ms, the speed of the combination will be 19 ms, which makes the series-connected diodes faster than a single diode having a voltage rating that is the same as the combined voltage rating of the series-connected first diode 12 and second diode 14.

Semiconductor device package 10 according to the present invention may be preferably used in continuous mode PFC circuit. However, a semiconductor device package according to the present invention is not limited to such usage and may be adapted to any number of uses, particularly those that require high voltage rating at a higher speed than a single diode of the same voltage rating.

Although the present invention has been described in relation to particular embodiments thereof, many other variations and modifications and other uses will become apparent to those skilled in the art. It is preferred, therefore, that the present invention be limited not by the specific disclosure herein, but only by the appended claim.

What is claimed is:

1. A semiconductor device package comprising:
   a first diode having an anode electrode and a cathode electrode and being capable of blocking a reverse current up to a first rated voltage;
   a second diode having an anode electrode and a cathode electrode and being capable of blocking the reverse current un to a second rated voltage; and
   a common conductive pad;
   wherein said cathode electrode of said first diode is electrically connected to said anode electrode of said second diode by said common conductive pad, said anode electrode of said first diode is wire bondable and disposed on a major surface of said first diode occluding substantially all of said major surface of said first diode and said cathode electrode of said first diode is disposed on an opposing major surface of said first diode, and wherein said anode electrode of said second diode is disposed on a major surface of said second diode and said cathode electrode of said second diode is wire bondable and is disposed on an opposing major surface of said second diode occluding substantially all of said opposing major surface of said second diode.

2. A semiconductor device package according to claim 1, wherein said cathode electrode of said first diode is electrically connected and physically mounted to said common conductive pad by a layer of conductive adhesive, and wherein said anode electrode of said second diode is electrically connected and physically mounted to said common conductive pad by a layer of conductive adhesive, solder or adhesive tape.

3. A semiconductor device package according to claim 1, further comprising a first external lead electrically connected to said anode electrode of said first diode and a second external lead electrically connected to said cathode electrode of said second diode.

4. A semiconductor device package according to claim 3, wherein said first external lead and said anode electrode are connected by at least one bond wire and said second external lead and said cathode electrode are connected by at least another bond wire.

5. A semiconductor device package according to claim 1, further comprising a molded housing enclosing said first diode and said second diode.

6. A semiconductor device package according to claim 5, wherein a bottom surface of said common conductive pad is exposed out of said molded housing.

7. A semiconductor device package according to claim 1, further comprising a first external lead integrally connected to said common conductive pad to form a unitary paddle-shaped body, a second external lead electrically connected to said anode electrode of said first diode and a third external lead electrically connected to said cathode electrode of said second diode, wherein said first external lead, said second external lead and said third external lead are parallel and extend from a common side of said semiconductor device package.

8. A semiconductor device package according to claim 1, wherein said first diode and said second diode are disposed in one of a TO220, TO220FT, D2 pak, Dpak, and TO247 semiconductor device package,) the semiconductor device package having at least one external lead that is connected to the cathode electrode of said first diode and at least another external lead that is connected to the anode electrode of said second diode, the first and second rated voltages of the first diode and the second diode, respectively, being selected such that the rated voltage of the semiconductor device package is at least 600 volts and a reverse recovery time of the semiconductor device package is less than a reverse recovery time of an equivalently-rated semiconductor device using a single diode.

* * * * *